United States Patent
Mashiko et al.

[11] Patent Number: 4,788,457
[45] Date of Patent: Nov. 29, 1988

[54] CMOS ROW DECODER CIRCUIT FOR USE IN ROW AND COLUMN ADDRESSING

[75] Inventors: Koichiro Mashiko; Kazutami Arimoto; Kiyohiro Furutani; Noriaki Matsumoto; Yoshio Matsuda, all of Hyogo, Japan

[73] Assignee: Mitsubishi Denki Kabushiki Kaisha, Tokyo, Japan

[21] Appl. No.: 94,641

[22] Filed: Sep. 9, 1987

[30] Foreign Application Priority Data

Sep. 9, 1986 [JP] Japan ................. 61-213114

[51] Int. Cl.$^4$ ........................... H03K 19/096
[52] U.S. Cl. .................... 307/449; 307/451; 307/463; 307/481; 365/203
[58] Field of Search .......... 307/443, 448, 449, 451, 307/452, 453, 463, 481; 365/189, 203, 233

[56] References Cited

U.S. PATENT DOCUMENTS

| 4,200,917 | 4/1980 | Moench | 307/449 X |
| 4,275,312 | 6/1981 | Saitou et al. | 307/449 X |
| 4,309,629 | 1/1982 | Kamuro | 307/449 |
| 4,446,386 | 5/1984 | Kurafuji | 307/449 |
| 4,571,510 | 2/1986 | Seki et al. | 307/449 |
| 4,700,086 | 10/1987 | Ling et al. | 307/443 |
| 4,730,133 | 3/1988 | Yoshida | 307/449 |

OTHER PUBLICATIONS

IEEE, Katsutaka Kimura et al, "Power Reduction Techniques in Megabit DRAMS's", vol. SC-21, No. 3, Jun. 1986, pp. 381-389.
Hafani, "Bit Line Discharge Circuit for NAND Logic Read-Only Storage Arrays", IBM T.D.B., vol. 23, No. 7B, Dec. 1980, pp. 3181-3182.
Lane et al, "FET Parallel Decoder", IBM T.D.B., vol. 11, No. 5, Oct. 1968, p. 444.

Primary Examiner—Stanley D. Miller
Assistant Examiner—D. R. Hudspeth
Attorney, Agent, or Firm—Lowe, Price, Leblanc, Becker & Shur

[57] ABSTRACT

A CMOS row decoder circuit in which a row decoder for selecting a single word line from a memory cell array and a column decoder for selecting a single bit line can use in common an internal address signal transmission line. The row decoder circuit comprises a series of MOSFETs of a first conductivity type which is turned on or off in response to address signals selected from external address signals, a second MOSFET of a second conductivity type provided between a power supply potential and the series of MOSFETs and having a gate receiving a first timing signal for providing decoding timing of the address signals, a third MOSFET of the first conductivity type provided between the series of MOSFETs and the second MOSFET and having a gate receiving a first operation timing signal, a fourth MOSFET which is turned on or off in response to a second operation timing signal for transmitting the potential of a node of the second MOSFET and the third MOSFET, and a fifth MOSFET having a gate receiving an output of the fourth MOSFET for transmitting a word line driving signal to a corresponding word line.

4 Claims, 6 Drawing Sheets

CMOS ROW DECODER CIRCUIT FOR USE IN ROW AND COLUMN ADDRESSING

BACKGROUND OF THE INVENTION

1. Field of the Invention

The present invention relates to a row decoder circuit having a CMOS structure and more particularly, to a row decoder circuit used in a dynamic memory.

2. Description of the Prior Art

FIG. 1 is a diagram showing an example of a structure of a conventional row decoder circuit, which is disclosed in, for example, IEEE, Journal of Solid-State Circuits, vol. SC-21, No. 3, June 1986, p. 384.

In FIG. 1, a conventional row decoder circuit comprises a first stage for decoding applied address signals, an inverter stage for inverting and amplifying an output of the first stage and transmitting the same, and a driver stage responsive to an output of the inverter stage for transmitting a word line driving signal to a word line.

The first stage comprises a p channel MOS transistor 1 having a gate receiving a reset signal $\phi_p$ for providing reset timing of the row decoder circuit, and n channel MOS transistors 3 to 4 each having a gate receiving one of address signals $A_0$ to $A_n$ selected from external address signals, and connected in series with the p channel MOS transistor 1 and connected in series with each other. The p channel MOS transistor 1 has one conduction terminal connected to a power supply potential $V_{cc}$ and the n channel MOS transistor 4 has other conduction terminal connected to a ground potential.

The inverter stage comprises a p channel MOS transistor 5 and an n channel MOS transistor 6, which are complimentarily connected, each having a gate electrode connected to a node (referred to as a node N1 hereinafter) of the p channel MOS transistor 1 and the n channel MOS transistor 3. The p channel MOS transistor 5 has one conduction terminal connected to the power supply potential $V_{cc}$ and the n channel MOS transistor 6 has other conduction terminal connected to the ground potential.

The driver stage comprises n channel MOS transistors 8 to 9 each having a gate receiving the power supply potential $V_{cc}$ for transmitting the output (the potential at a node N2) of the inverter stage, and n channel MOS transistors 10 to 11 each having a gate receiving each of signals transmitted by the n channel MOS transistors 8 to 9 for transmitting respective word line driving signals $\phi_{xo}$ to $\phi_{xi}$ to word lines WL1 to WL2 connected thereto. The word line driving signals $\phi_{xo}$ to $\phi_{xi}$ are formed in accordance with the external address signals. Thus, a single word line is selected by a combination of the address signals $A_0$ to $A_n$ and the word line driving signals $\phi_{xo}$ to $\phi_{xi}$. In addition, a plurality of word lines are connected to an output of the row decoder circuit. As a pitch between word lines is made finer in an increased integrity of a memory, it becomes difficult to achieve a structure in which a single row decoder circuit is provided with a single word line. Thus, a plurality of word lines are used in common by a single unit row decoder circuit to accommodate the reduced pitch between word lines.

FIG. 2 is a waveform diagram of timing showing operation of the row decoder circuit shown in FIG. 1. Referring now to FIGS. 1 and 2, description is made on the conventional row decoder circuit.

When the reset signal $\phi_p$ rises and the p channel MOS transistor 1 is turned off, the row decoder circuit is rendered active. The row decoder circuit is selected in accordance with a combination of address signals subsequently applied. More specifically, if and when all the address signals $A_0$ to $A_n$ connected to the row decoder circuit are at a "1" level, the MOS transistors 3 to 4 included in the row decoder circuit are turned on so that the node N1 is discharged. As a result, the row decoder circuit is selected. On the other hand, if at least one of the address signals $A_0$ to $A_n$ applied thereto is at a "0" level, at least one of the MOS transistors 3 to 4 is turned off, so that the node N1 is not discharged and held at a high potential level. The potential appearing on the node N1 is transmitted to the node N2 through the inverter stage comprising the transistors 5 and 6. The potential on the node N2 is transmitted to gate electrodes of the MOS transistors 10 to 11 for driving word lines through the transistors 8 to 9, respectively. More specifically, if the row decoder circuit is selected, a high potential is applied to the gate electrodes of the MOS transistors 10 to 11. If the row decoder circuit is not selected, a low potential is applied to the gate electrodes of the MOS transistors 10 to 11. Thus, only if the row decoder circuit is selected, the transistors 10 to 11 are turned on, so that the word line driving signals $\phi_{xo}$ to $\phi_{xi}$ formed in accordance with the external address signals are transmitted to the word lines WL1 to WL2, respectively. Thus, the potential on a word line receiving the word line driving signal at an "H" level rises, so that a single word line is selected. The transistors 8 and 9 perform functions of decreasing stray capacitance of a gate electrode of each transistor by rendering non-conductive between the node N2 and the gate electrodes of the transistors 10 to 11 when the word line driving signals $\phi_{xo}$ to $\phi_{xi}$ are applied in the selected state, in order to improve the signal transmission characteristics of the transistors 10 to 11 due to the self-bootstrap effect.

Since the conventional row decoder circuit has the above described structure, there were some problems. For example, while the reset signal $\phi_p$ is at a high level (the row decoder circuit is rendered active), the state of the address signals must be held. When the address signals are received in a time-divisional manner for a row and a column as in a dynamic memory, two sets of address buffers are required for row address signals and column address signals. In addition, address signal lines for transmitting the row address signals and the column address signals to the row decoder circuit and a column decoder circuit within a memory, respectively, must be separately provided and interconnected, so that the area of a semiconductor chip having a semiconductor memory device or devices formed is increased due to the area of the interconnection, the area for constituting the buffer and the like.

SUMMARY OF THE INVENTION

An object of the present invention is to solve the above described problems and to provide a row decoder circuit having a CMOS structure in which the identical address signal line can be used in common by a row address signal and a column address signal, and the first stage is not discharged so that a charging current at the time of the next reset cycle is not increased even if a series of column address signals are applied to the address signal line subsequently to the row address signal.

The CMOS row decoder circuit according to the present invention is adapted such that an MOS transistor of a first conductivity type having a gate receiving a reset signal (a first operation timing signal) is connected between an MOS transistor for charging, of a second conductivity type having a gate receiving the reset signal and MOS transistors for decoding each having a gate receiving each of address signals and connected in series with each other in a first stage, and a second operation timing signal is applied to a gate electrode of the MOS transistor of the second conductivity type for transmitting an output of an inverter stage to a gate electrode of a word line driving transistor for transmitting a word line driving signal to the word line.

It is desirable that the reset signal is generated at timing of turning a charging transistor on after a second operation timing signal turns a transmission transistor off.

In the row decoder circuit having a CMOS structure according to the present invention, a transistor for transmitting the output of the inverter stage to a gate of the word line driving transistor is turned off by a timing signal applied to the gate thereof after the selected/non-selected state of the row decoder circuit is determined so that the first stage and the word line driving transistors are disconnected to hold the determined state of the output of the row decoder circuit irrespective of the state of the column address signal subsequently applied. On the other hand, a transistor newly inserted is turned off in response to the reset signal after the state of the row decoder circuit is determined, so that the effect of the column address signals subsequently applied on charging operation of a node N1 is eliminated.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
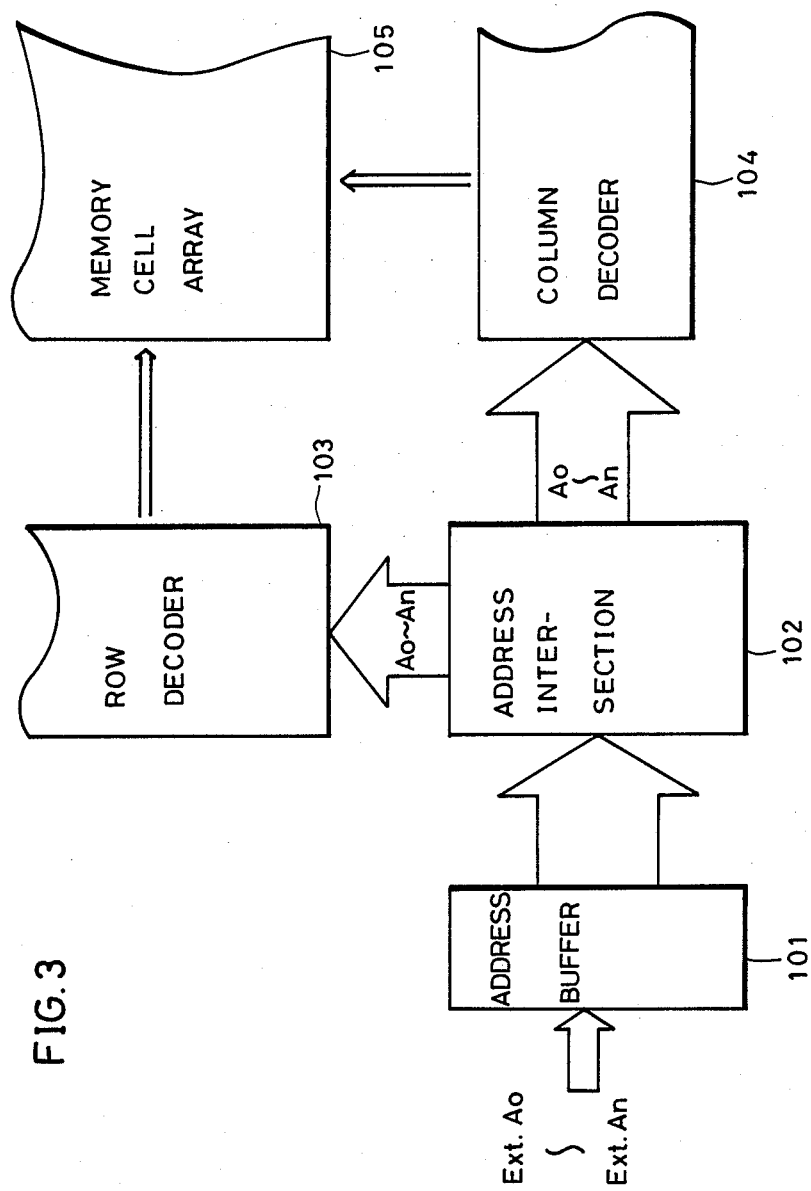
FIG. 3 is a diagram showing a schematic arrangement of a row decoder and a column decoder according to the present invention.

FIG. 3 is a diagram showing a schematic structure of a decoder portion of a semiconductor memory device comprising a row decoder circuit according to the present invention.

In FIG. 3, the decoder portion comprises an address buffer 101 receiving external address signals Ext. $A_0$ to Ext. $A_n$ for transmitting the same to the inside of the memory device, an address intersection 102 receiving the address signals from the address buffer 101 for transmitting the internal address signals $A_0$ to $A_n$ to both of a row decoder 103 and a column decoder 104, respectively, the row decoder 103 receiving the internal addresses $A_0$ to $A_n$ from the address intersection 102 for selecting a single word line from a memory cell array 105, and the column decoder 104 receiving the internal addresses (column addresses) $A_0$ to $A_n$ from the address intersection 102 for selecting a single bit line from the memory cell array 105. As seen from FIG. 3, the address buffer 101 receiving the external address signals is used in common by the row decoder 103 and the column decoder 104, and address signals which are in phase are transmitted to the row decoder 103 and the column decoder 104 through the address intersection 102. Thus, an internal address signal line is used in common by the row decoder 103 and the column decoder 104.

Figure 4:
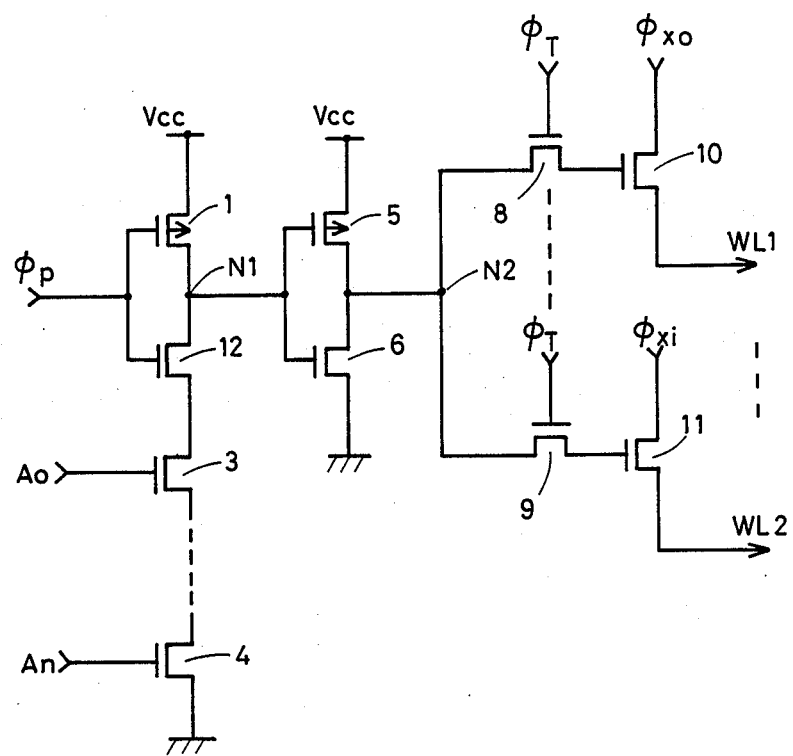
FIG. 4 is a diagram showing a structure of a CMOS row decoder circuit according to an embodiment of the present invention.

FIG. 4 is a diagram showing a structure of the CMOS row decoder circuit constituting the row decoder shown in FIG. 3. The row decoder 103 shown in FIG. 3 comprises a plurality of row decoder circuits. Referring now to FIG. 4, description is made on a structure of the CMOS row decoder circuit according to an embodiment of the present invention.

Figure 1:
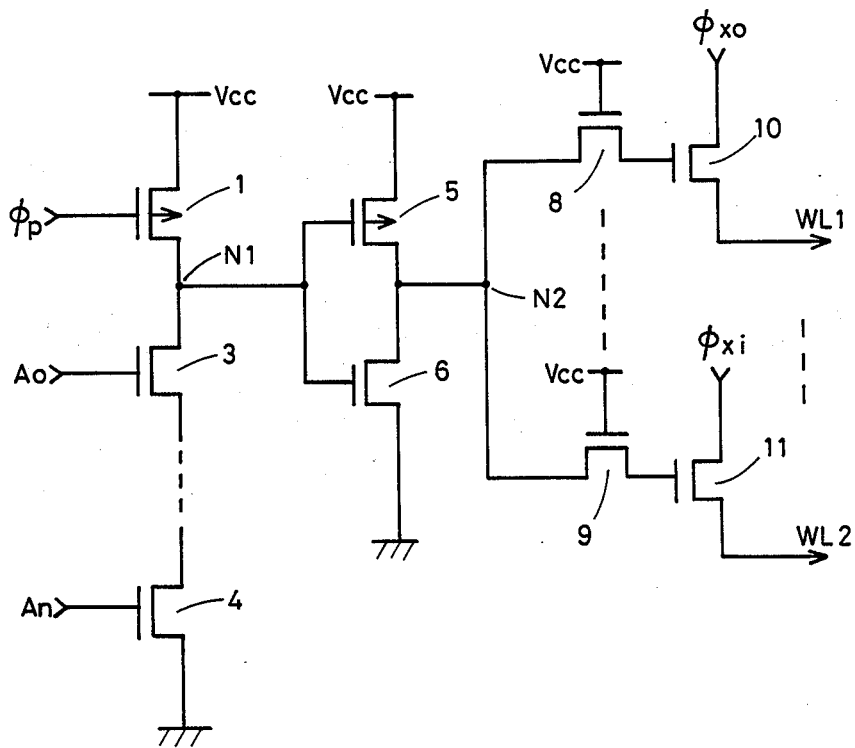
FIG. 1 is a diagram showing a structure of a conventional CMOS row decoder circuit.
Figure 2:
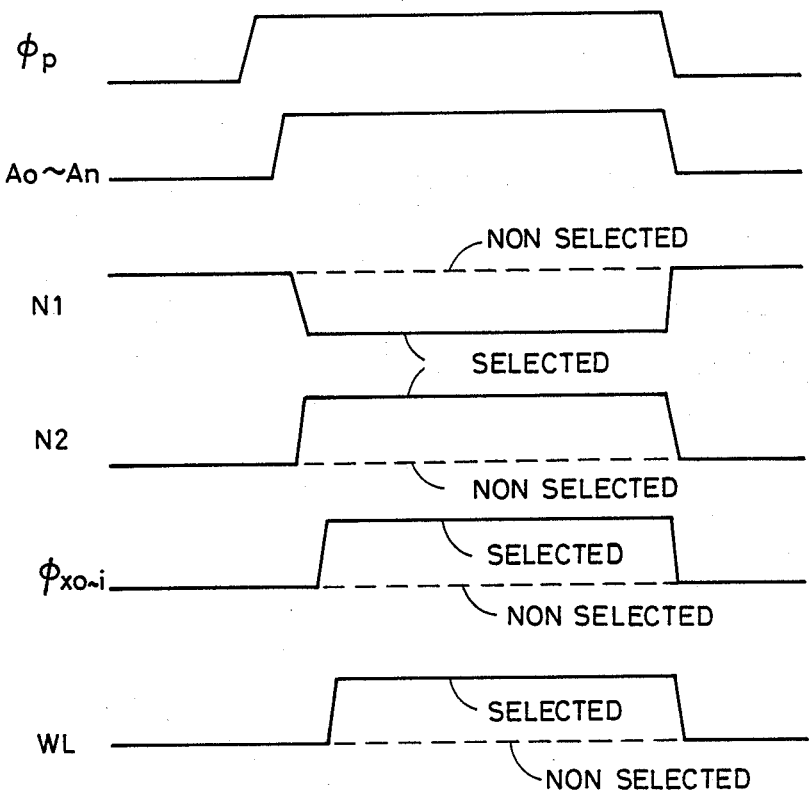
FIG. 2 is a waveform diagram showing operation of the conventioonal row decoder circuit shown in FIG. 1.

In FIG. 4, portions identical or corresponding to those in a structure of the conventional row decoder circuit shown in FIG. 1 have the identical reference numerals.

The CMOS row decoder circuit according to an embodiment of the present invention as shown in FIG. 4 has a different structure from that of the conventional row decoder circuit, in which an n channel MOS transistor 12 having a gate receiving a reset signal $\phi_p$ to be turned on or off is provided between a p channel charging MOS transistor 1 having a gate receiving the reset signal $\phi_p$ and n channel MOS transistors 3 to 4 each having a gate receiving respective address signals (row address signals and column address signals) $A_0$ to $A_n$, and a transfer signal $\phi_T$ which is an operation timing signal is applied to respective gates of transmission transistors 8 to 9 for transmitting an output of an inverter stage to the respective gates of transistors 10 to 11 for driving word lines. Since the row decoder circuit has a structure in which the address signal line is used in common by the row address signal and the column address signal, the address signals $A_0$ to $A_n$ are either the row address signals or the column address signals. Remaining structures are the same as those of the conventional row decoder circuit shown in FIG. 1. The transfer signal $\phi_T$ is at an "L" level after the selected/non-selected state of the row decoder circuit is determined, so that the transmission transistors 8 to 9 are turned off. In addition, the reset signal $\phi_P$ falls to the "L" level after the transfer signal $\phi_T$ falls.

Figure 5:
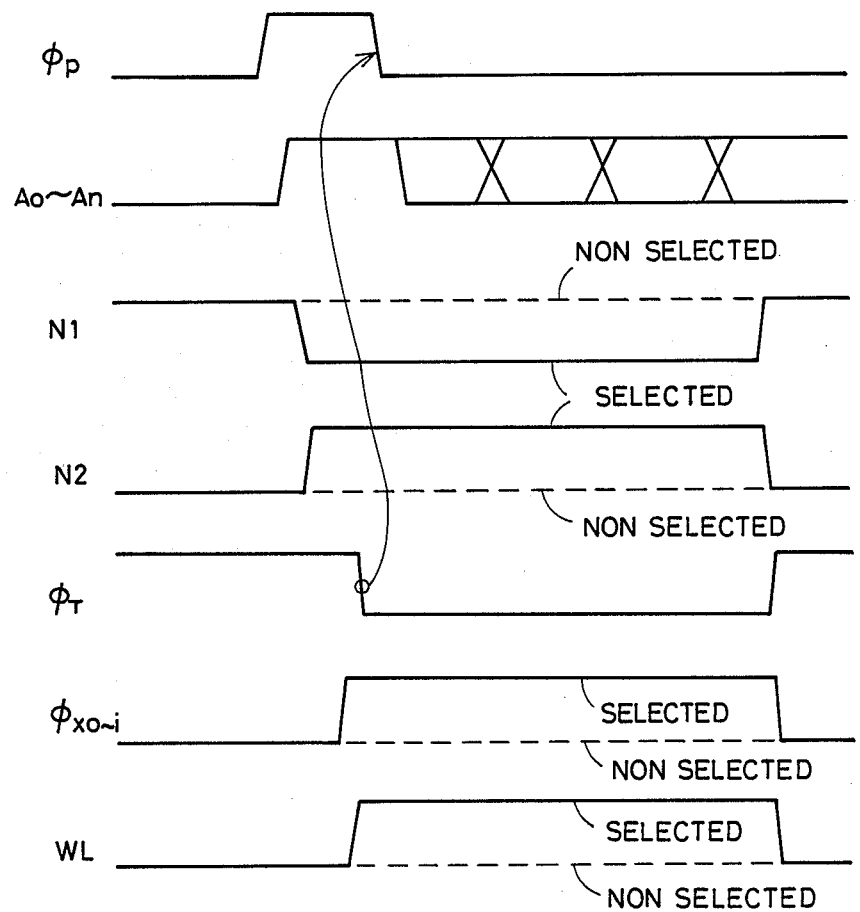
FIG. 5 is a waveform diagram showing operation timing of the CMOS row decoder circuit according to an embodiment of the present invention.

FIG. 5 is a waveform diagram of timing showing operation of the CMOS row decoder circuit shown in FIG. 4. Referring now to FIGS. 4 and 5, description is made on operation of the CMOS row decoder circuit according to an embodiment of the present invention.

When the reset signal $\phi_p$ rises to an "H" level, the row decoder circuit is activated, so that the p channel MOS transistor 1 is turned off and the n channel MOS transistor 12 is turned on. Only when all the address signals $A_0$ to $A_n$ applied to the respective gates of the n channel MOS transistors 3 to 4 are at a "H" level, the transistors 3 to 4 are turned on, so that a node N1 is discharged and attains the "L" level. As a result, the row decoder circuit is selected. At that time, the potential on the node N1 is transmitted to the node N2 through the inverter stage comprising transistors 5 and 6, so that a node N2 attains the "H" level. At that time, since the transfer signal $\phi_T$ is still at the "H" level, the transmission transistors 8 to 9 are on-state, so that the potential on the node N2 is transmitted to gate electrodes of the word line driving transistors 10 to 11. Only when the row decoder circuit is selected, the word line driving transistors 10 to 11 are turned on, so that word line driving signals $\phi_{xo}$ $\phi_{xi}$ produced in accordance with the external address signals are transmitted to word lines WL1 to WL2 connected thereto, respectively, the potential of a single word line selected by the address signals $A_0$ to $A_n$ and the word line driving signals $\phi_{xo}$ to $\phi_{xi}$ rises, and the word line is selected. When the transmission signal $\phi_T$ falls to the "L" level, the transmission transistors 8 to 9 are turned off, so that the potentials at the gates of the word line driving transistors 10 to 11 are enclosed. Thus, each of the transistors 10 to 11 is held in the first determined state in cooperation with the self bootstrap effect of the word line driving transistors 10 to 11. When the reset signal $\phi_p$ falls from the "H" level to the "L" level, the p channel MOS transistor 1 is turned on and the n channel MOS transistor 12 is turned off, so that the node N1 of the selected row decoder circuit is charged from the "L" level to the "H" level through the p channel MOS transistor 1. The potential of the node N1 of the non-selected row decoder circuit is held at the "H" level. Thereafter, even if various potentials are applied to the gates of the transistors 3 to 4 as column address signals, the output state of the row decoder circuit does not change at all because the n channel MOS transistor 12 is turned off, so that the selected word line is held constantly at a high level.

On the other hand, when the reset signal $\phi_p$ falls, charging of the node N1 is started. However, the row decoder circuit to be charged is only a selected row decoder circuit in any case. Therefore, even in an operation cycle in which the column address signals are continuously applied with the row address signal being constant, a charging current for charging the node N1 does not change. As a result, the consumed current is not increased even though the operation cycle proceeds, so that the temperature of a semiconductor chip in which a dynamic memory is formed is not increased and stable decoding operation can be performed.

Although in the above described embodiment, a supply voltage $V_{cc}$ is applied to one terminal (a source) of the p channel MOS transistor 5 constituting the inverter stage, an address signal may be applied thereto.

Figure 6:
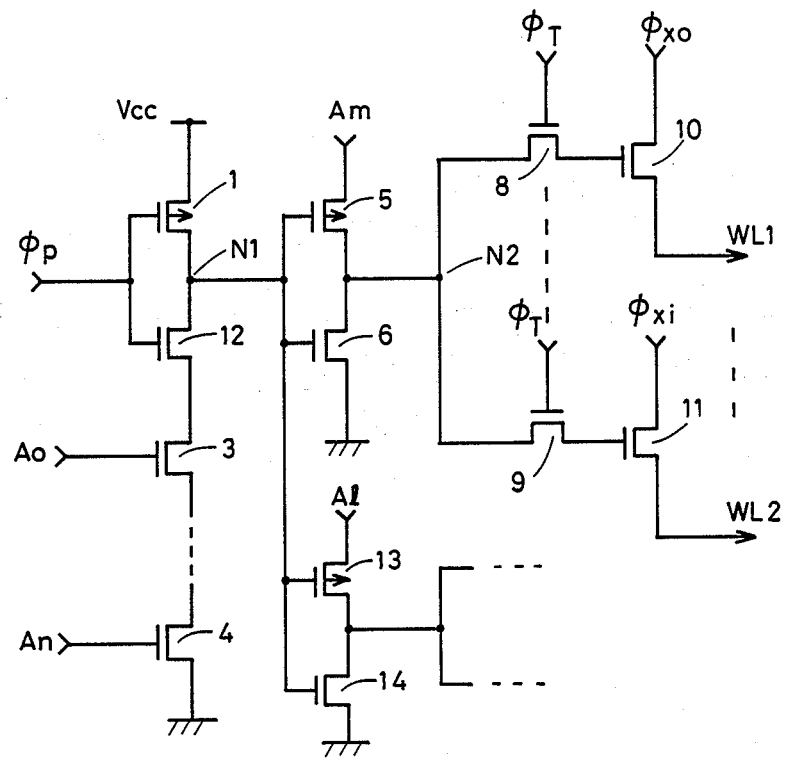
FIG. 6 is a diagram showing a structure of a CMOS row decoder circuit according to another embodiment of the present invention.

FIG. 6 is a diagram showing a structure of a CMOS row decoder circuit according to another embodiment of the present invention. In FIG. 6, a plurality of CMOS inverter circuits each provided for a plurality of word lines are provided in parallel with each other, and address signals Am to Al suitably selected form the external address signal are applied to a power supply terminal of each of the inverter circuits. More specifically, the word lines WL1 to WL2 are provided with an inverter circuit comprising a p channel MOS transistor 5 and an n channel MOS transistor 6, and another group of word lines is provided with an inverter circuit comprising a p channel MOS transistor 13 and an n channel MOS transistor 14. The address signal Am suitably selected from the external address signal is applied to a power supply terminal (p channel MOS transistor) of the inverter circuit comprising the transistors 5 and 6, and the address signal Al is applied to a power supply terminal (a source of the p channel MOS transistor 13) of the inverter circuit comprising the transistors 13 and 14. In such a structure, since more word lines can be used in common by a single row decoder circuit, the area required for a row decoder can be reduced in a pattern layout, which is more effective in high integration of the semiconductor memory.

As described in the foregoing, according to the present invention, a transmission transistor is controlled by an operation timing signal in a manner that the transmission transistor is turned off after the selected/non-selected state of the row decoder circuit is determined, and an MOS transistor of a second conductivity type which is turned on or off in response to a reset signal is newly provided between a charging transistor of a first conductivity type and a decoding transistor, and the newly provided transistor is turned off after the transmission transistor is turned off so that the row decoder circuit is charged. Thus, in a CMOS row decoder circuit of the present invention mulfunction is not performed, the charging current is not increased and the consumed power is not increased even if the identical address signal line and an address buffer are used in common by a row address signal and a column address signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A row decoder circuit having a CMOS structure receiving a plurality of address signals included in external address signals for decoding the same, transmitting a word line driving signal produced in accordance with said external address signals to a word line and selecting the word line based on the decoded result, comprising:
    a plurality of first MOS transistors of a first conductivity type connected in series with each other and each having a gate receiving one of said plurality of address signals,
    a second MOS transistor of a second conductivity type connected between said plurality of first MOS transistors connected in series with each other and a power supply potential and having a gate receiving a first operation timing signal for providing decoding timing of said plurality of address signals,
    a third MOS transistor of the first conductivity type connected between said plurality of first MOS transistors connected in series with each other and said second MOS transistor and having a gate receiving said first operation timing signal,
    a fourth MOS transistor having a gate receiving a second operation timing signal for transmitting a signal corresponding to an output of a node between said second MOS transistor and said third MOS transistor, and
    a fifth MOS transistor of the first conductivity type having a gate receiving a signal transmitted through said fourth MOS transistor for transmitting the applied word line driving signal to the word line connected thereto.

2. A CMOS row decoder circuit in accordance with claim 1, wherein
    said second operation timing signal is generated at timing such that said first operation timing signal turns said second MOS transistor off and then, turns said second MOS transistor off, and said first operation timing signal is generated at timing such that said second operation timing signal turns said fourth MOS transistor off and then, turns said second MOS transistor on.

3. A CMOS row decoder circuit in accordance with claim 1, wherein
an inverter and amplifier circuit is provided between said node between said second MOS transistor and said third MOS transistor and said fourth MOS transistor, and an address signal selected from said external address signals is applied to a power supply potential terminal of said inverter and amplifier circuit.

4. A CMOS row decoder circuit in accordance with claim 1, wherein
a buffer circuit receiving said external address signals for transmitting the same to said CMOS row decoder circuit and a buffer circuit receiving a column address signal externally applied for transmitting the same to a column decoder for selecting a bit line corresponding to said external column address signal are used in common, so that an internal address signal line is used in common by said CMOS row decoder circuit and said column decoder circuit.

* * * * *